(12) United States Patent
Choi et al.

(10) Patent No.: US 10,388,830 B2
(45) Date of Patent: Aug. 20, 2019

(54) LIGHT EMITTING DEVICE PACKAGE AND LIGHT EMITTING DEVICE COMPRISING SAME

(71) Applicant: LG INNOTEK CO., LTD., Seoul (KR)

(72) Inventors: Jin Kyung Choi, Seoul (KR); Jun Hee Hong, Seoul (KR); Sang Youl Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/506,801

(22) PCT Filed: Jul. 28, 2015

(86) PCT No.: PCT/KR2015/007827
§ 371 (c)(1),
(2) Date: Feb. 27, 2017

(87) PCT Pub. No.: WO2016/032134
PCT Pub. Date: Mar. 3, 2016

(65) Prior Publication Data
US 2017/0256675 A1 Sep. 7, 2017

(30) Foreign Application Priority Data

Aug. 28, 2014 (KR) ........................ 10-2014-0113078

(51) Int. Cl.
| | |
|---|---|
| H01L 33/12 | (2010.01) |
| H01L 33/20 | (2010.01) |
| H01L 33/40 | (2010.01) |
| H01L 33/52 | (2010.01) |
| H01L 33/62 | (2010.01) |
| H01L 33/50 | (2010.01) |

(52) U.S. Cl.
CPC .............. *H01L 33/12* (2013.01); *H01L 33/20* (2013.01); *H01L 33/405* (2013.01);
(Continued)

(58) Field of Classification Search
USPC ........................................................ 257/98
See application file for complete search history.

(56) References Cited

U.S. PATENT DOCUMENTS

| | | | |
|---|---|---|---|
| 7,084,353 B1 * | 8/2006 | Downes ................ | H05K 1/111 174/255 |
| 7,416,106 B1 * | 8/2008 | Downes ............... | B23K 1/0016 228/180.21 |

(Continued)

FOREIGN PATENT DOCUMENTS

| | | |
|---|---|---|
| CN | 102315352 | 1/2012 |
| EP | 2 393 132 | 12/2011 |

(Continued)

OTHER PUBLICATIONS

International Search Report (with English Translation) and Written Opinion dated Sep. 24, 2015 issued in Application No. PCT/KR2015/007827.

(Continued)

*Primary Examiner* — Marcos D. Pizarro
*Assistant Examiner* — Lawrence C Tynes, Jr.
(74) *Attorney, Agent, or Firm* — KED & Associates, LLP

(57) ABSTRACT

A light emitting device package according to an embodiment comprises: a light emitting device comprising a light emitting structure including a first conductive semiconductor layer, an active layer, and a second conductive semiconductor layer; first and second lead frames disposed to be spaced apart from each other; first and second solder portions disposed on the first and second lead frames, respectively; and first and second pads disposed between the first and second solder portions and the first and second conductive semiconductor layers, respectively, wherein at least one of the first or second pad comprises at least one of a rounding portion and a chamfer portion, wherein the first pad comprises a first-first edge and a first-second edge being posi- (Continued)

tioned farther than the first-first edge from the center of the light emitting device, wherein the second pad comprises a second-first edge and a second-second edge being positioned farther than the second-first edge from the center of the light emitting device, and wherein the rounding portion or the chamfer portion is positioned at at least one of the first-second edge or the second-second edge.

19 Claims, 9 Drawing Sheets

(52) U.S. Cl.
 CPC ............ *H01L 33/502* (2013.01); *H01L 33/52* (2013.01); *H01L 33/62* (2013.01); *H01L 2224/16245* (2013.01); *H01L 2933/0066* (2013.01)

(56) References Cited

U.S. PATENT DOCUMENTS

| | | | | |
|---|---|---|---|---|
| 2009/0008773 A1* | 1/2009 | Wong | ...................... | H01L 21/50 257/720 |
| 2010/0320498 A1* | 12/2010 | Lin | ........................ | H01L 33/38 257/99 |
| 2011/0147779 A1* | 6/2011 | Kang | .................... | H01L 33/486 257/98 |
| 2014/0197436 A1* | 7/2014 | Kim | ........................ | H01L 24/17 257/98 |
| 2014/0339584 A1* | 11/2014 | Kim | .................... | C09K 11/0883 257/98 |
| 2015/0091041 A1* | 4/2015 | Yoon | ....................... | H01L 27/15 257/99 |

FOREIGN PATENT DOCUMENTS

| | | | | |
|---|---|---|---|---|
| EP | 2393132 | * | 12/2011 | ............ H01L 33/38 |
| KR | 10-0812737 | | 3/2008 | |
| KR | 10-2011-0084138 | | 7/2011 | |
| KR | 10-2013-0072413 | | 7/2013 | |

OTHER PUBLICATIONS

Chinese Office Action dated Jun. 4, 2018 issued in Application No. 2015800465711 (English translation attached).

* cited by examiner

[FIG. 1]
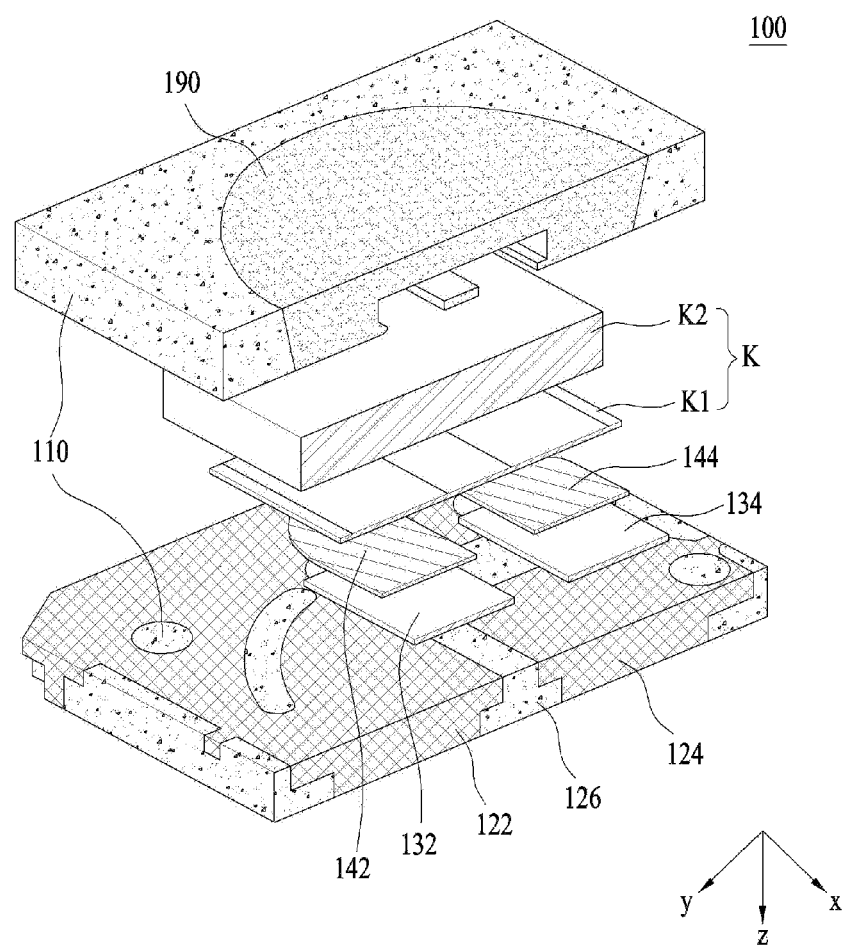

[FIG. 2]
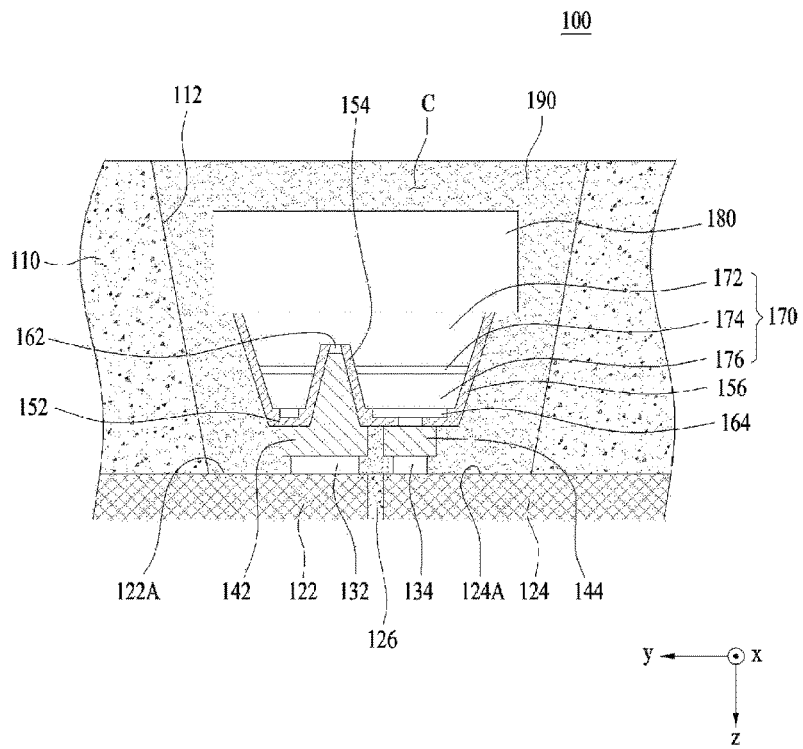
[FIG. 3]
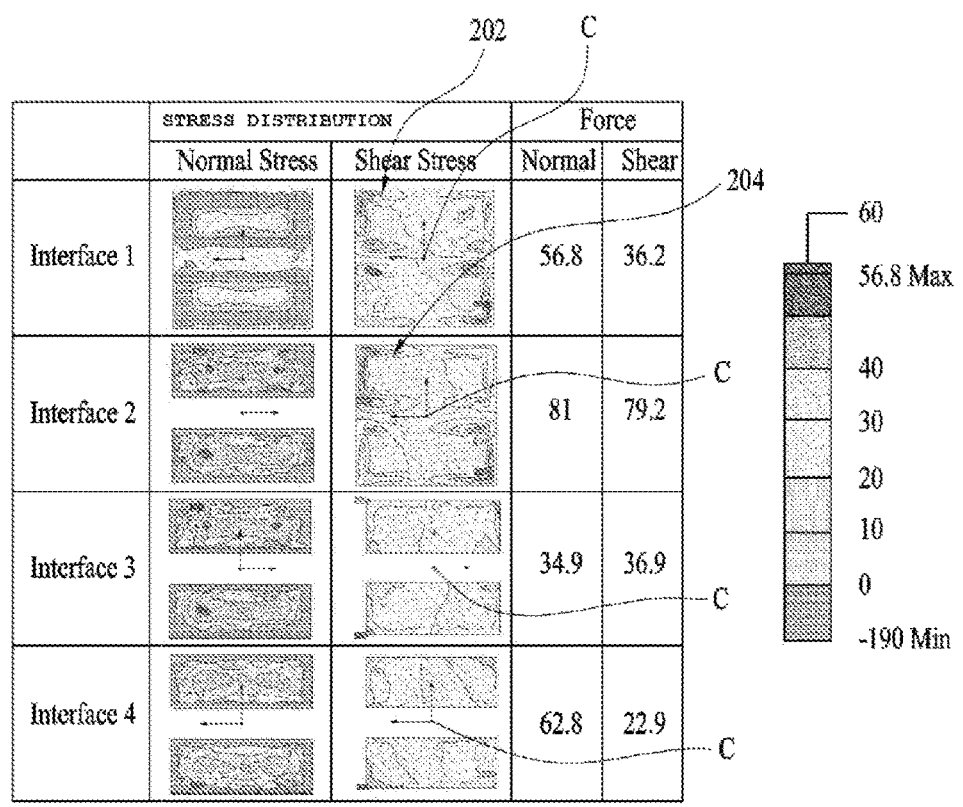

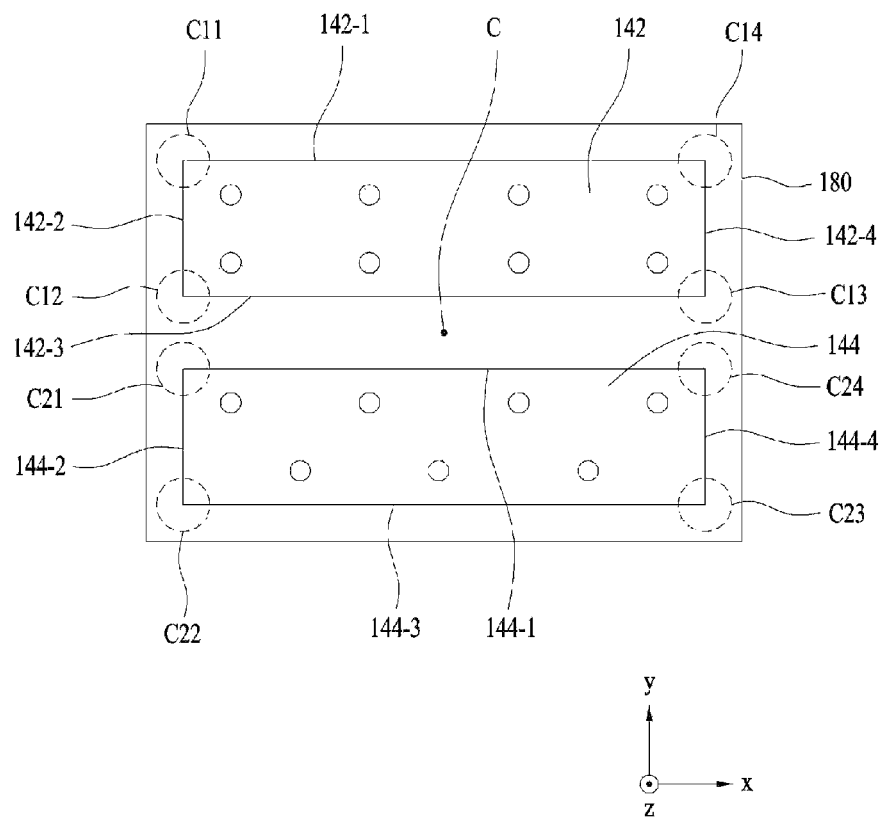
[FIG. 4]

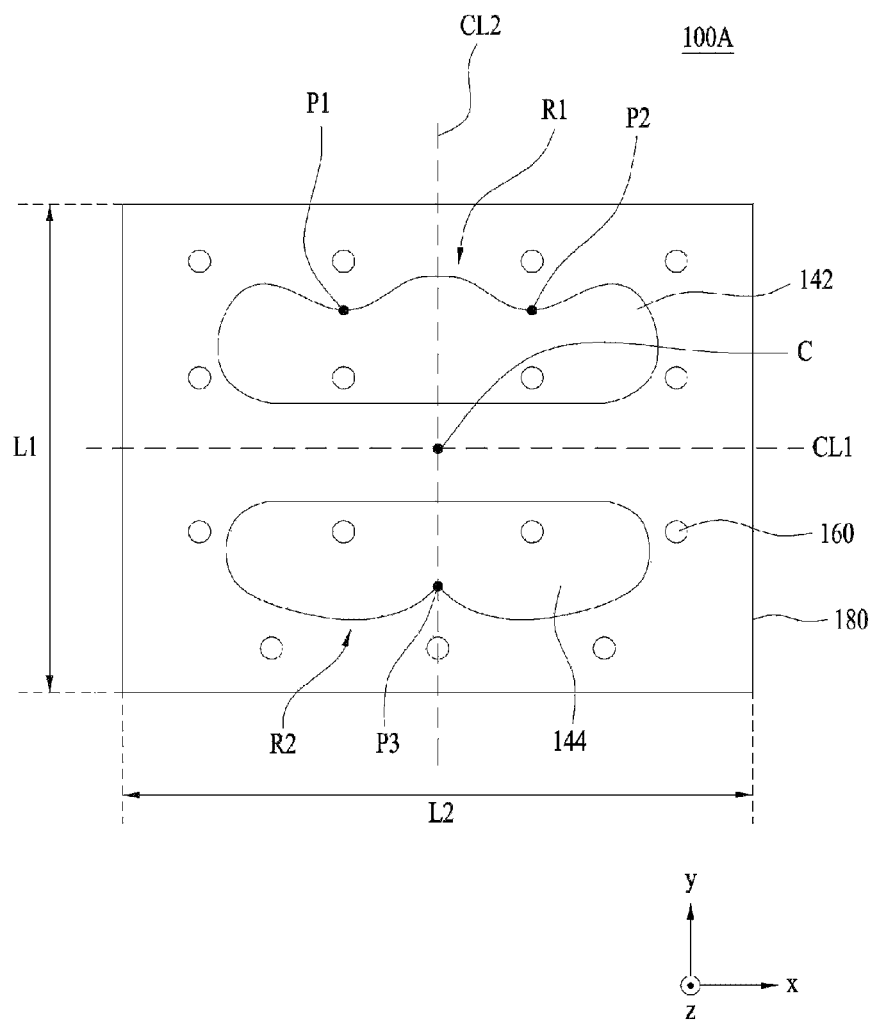

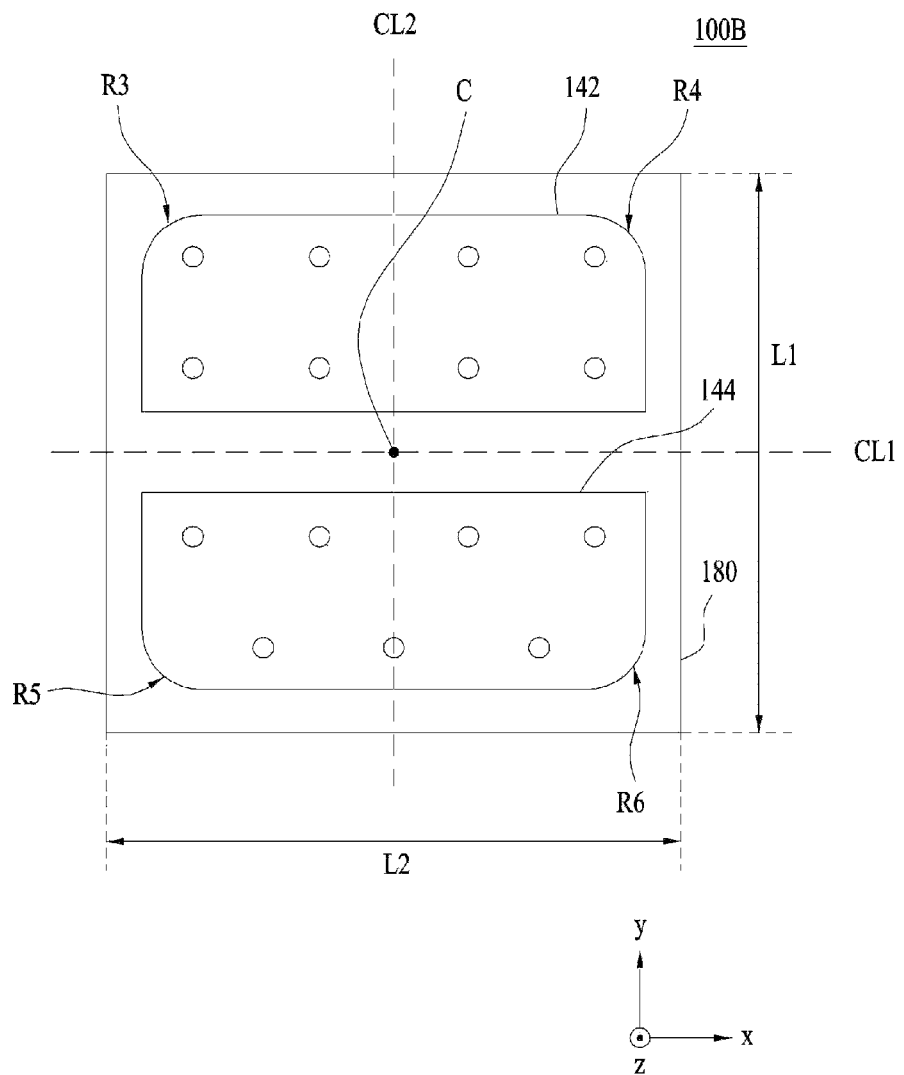

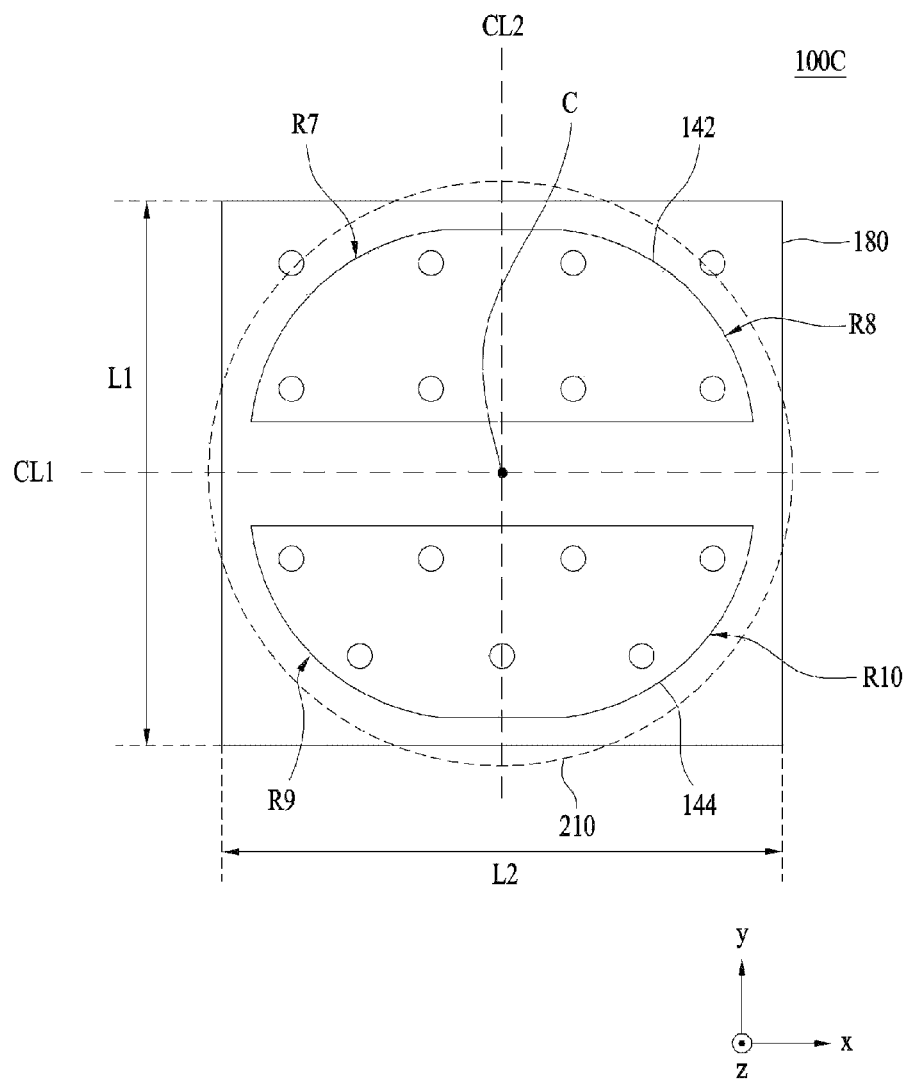
[FIG. 5C]

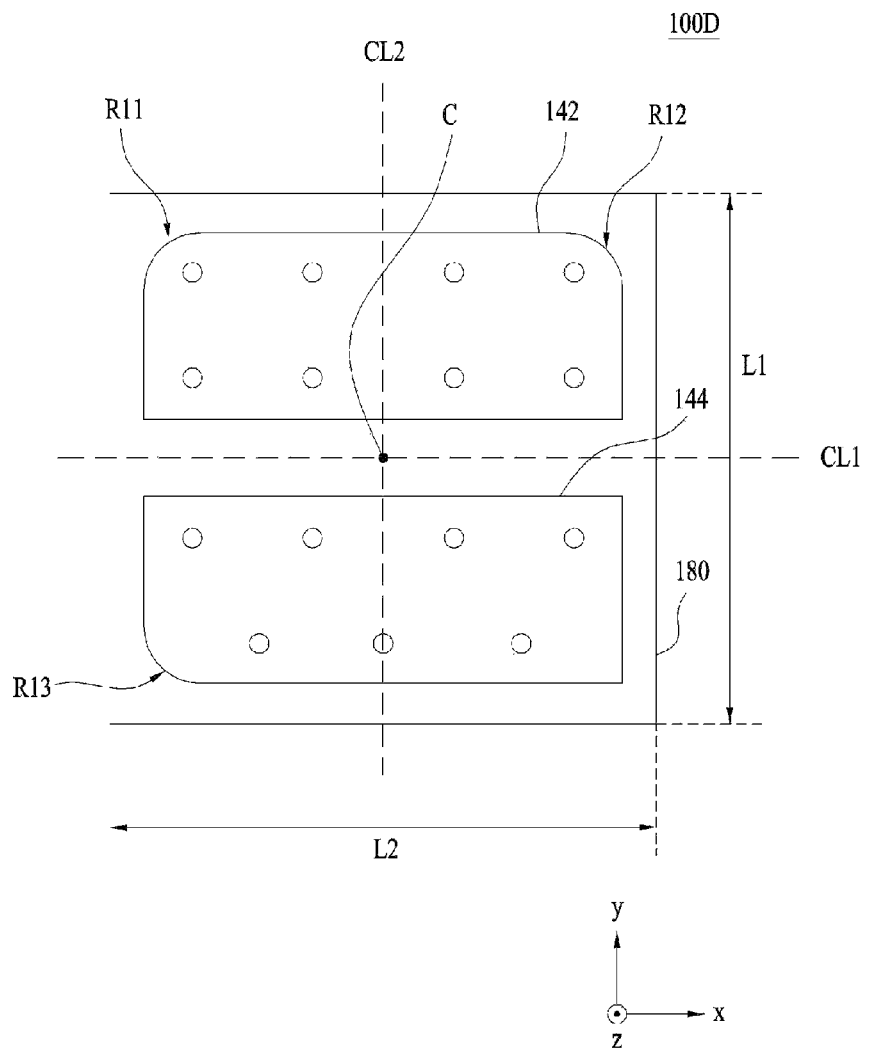
[FIG. 5D]

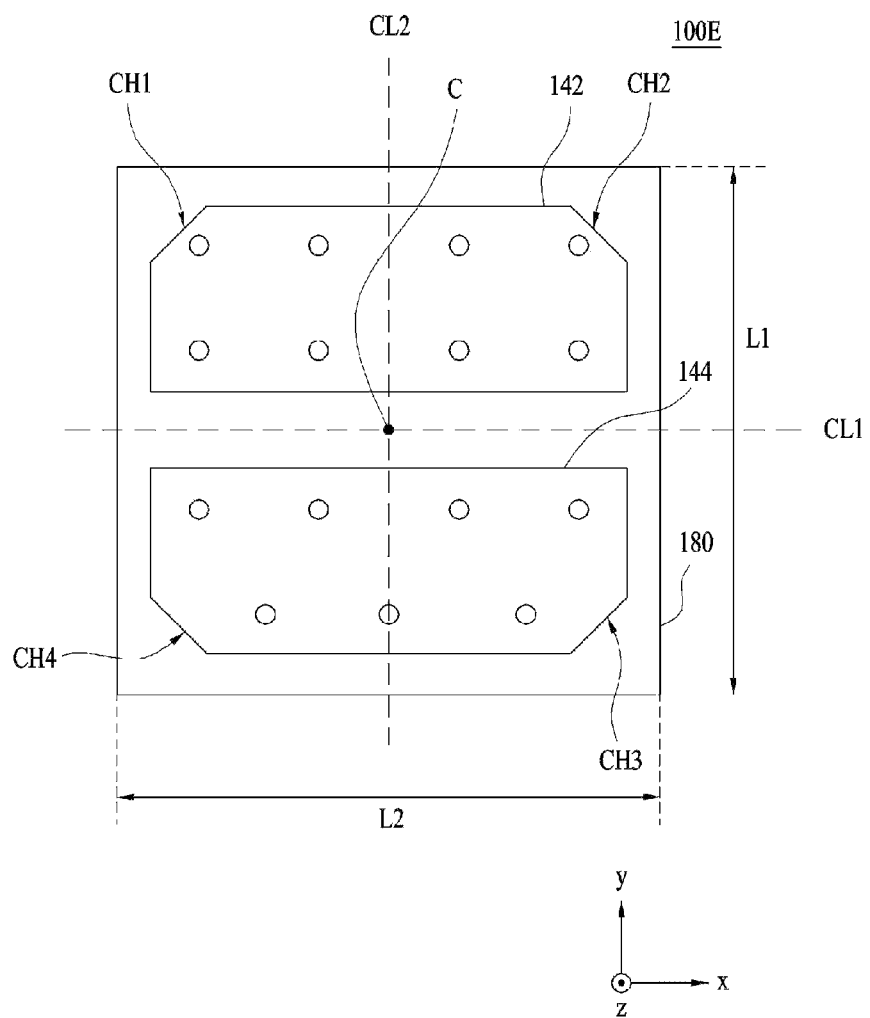
[FIG. 5E]

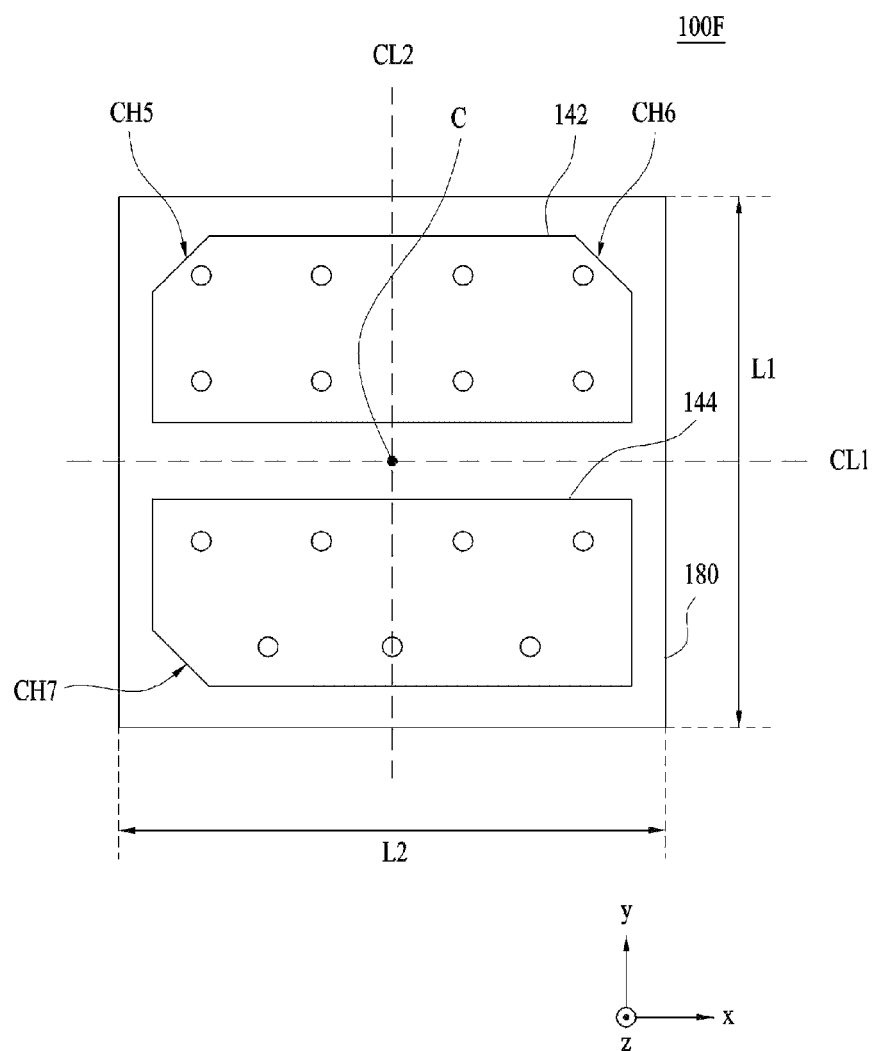
[FIG. 5F]

LIGHT EMITTING DEVICE PACKAGE AND LIGHT EMITTING DEVICE COMPRISING SAME

CROSS-REFERENCE TO RELATED PATENT APPLICATIONS

This application is a U.S. National Stage Application under 35 U.S.C. § 371 of PCT Application No. PCT/KR2015/007827, filed Jul. 28, 2015, which claims priority to Korean Patent Application No. 10-2014-0113078, filed Aug. 28, 2014, whose entire disclosures are hereby incorporated by reference.

TECHNICAL FIELD

Embodiments relate to a light emitting device package and a light emitting apparatus including the same.

BACKGROUND ART

Light emitting diodes (LEDs) are a kind of semiconductor devices that convert the electric power into infrared rays or light using the characteristics of compound semiconductors, in order to exchange signals, or be used as a light source.

Group III-V nitride semiconductors have been spotlighted as core materials for light emitting devices, such as light emitting diodes (LEDs) or laser diodes (LDs), by virtue of their physical and chemical properties.

Since such light emitting diodes do not contain environmentally harmful materials such as mercury (Hg) used for existing lighting apparatuses, such as incandescent lamps or fluorescent lamps, and have long lifespan and low power consumption, the light emitting diodes are a replacement for the existing light sources.

On the other hand, when two layers having different coefficients of thermal expansion are stacked, various stresses, for example shear stresses, may be caused to these layers. That is, when one of the two layers in the conventional light emitting device package forms a light emitting element and the other of the two layers forms a pad, if the pad is bonded to the light emitting element at 200° C. or higher, the initial failure and the cumulative fatigue are generated because of the residual stress due to the different coefficients of thermal expansion between the light emitting device and the pad so that the light emitting device package may be destroyed.

DISCLOSURE

Technical Problem

Embodiments provide a light emitting device package that relieves stress and has reliability, and a light emitting apparatus including the same.

Technical Solution

A light emitting device package according to an embodiment may include a light emitting device including a light emitting structure comprising a first conductive semiconductor layer, an active layer, and a second conductive semiconductor layer; first and second lead frames disposed to be spaced apart from each other; first and second solder portions disposed on the first and second lead frames, respectively; and first and second pads disposed between the first and second solder portions and the first and second conductive semiconductor layers, respectively, wherein at least one of the first or second pad may include at least one of a rounding portion or a chamfer portion, wherein the first and second pads may have a bottom shape in which the first and second pads are disposed to be spaced apart from each other with respect to a center of the light emitting device, wherein the first pad may include a first-first edge; and a first-second edge being positioned farther than the first-first edge from the center of the light emitting device, wherein the second pad may include a second-first edge; and a second-second edge being positioned farther than the second-first edge from the center of the light emitting device, and wherein the rounding portion or the chamfer portion may be positioned at at least one of the first-second edge or the second-second edge.

For example, each of the first-first, first-second, second-first, and second-second edges may include at least one of a corner or a side, the rounding portion may include at least one of a rounded corner or a curved side, and the chamfer portion may include at least one of a chamfered corner or an inclined side.

Each of the first and second pads may include a plurality of corners, and the rounded or chamfered corner may include a corner located farthest from the center of the light emitting device among the plurality of corners.

Each of the first and second pads may include a plurality of sides, and the curved side or inclined side may include a side located farthest from the center of the light emitting device among the plurality of sides.

The curved side may include at least one inflection point.

The light emitting device may further include first and second contact layers disposed between the first and second conductive semiconductor layers and the first and second pads, respectively. The first pad and the first contact layer may have different coefficients of thermal expansion, and the second pad and the second contact layer may have different coefficients of thermal expansion.

The first pad may be connected to the first conductive semiconductor layer by passing through the second contact layer, the second conductive semiconductor layer, and the active layer, and the light emitting device may further include an insulating layer disposed between the first pad and each of the second contact layer, the second conductive semiconductor layer, and the active layer. The insulating layer and each of the first and second pads may have different coefficients of thermal expansion.

A first radius of curvature of the rounding portion included in the first pad may be different from or be equal to a second radius of curvature of the rounding portion included in the second pad.

A first radius of curvature of the rounding portion included in the first pad may be equal, greater than, or less than to a second radius of curvature of the rounding portion included in the second pad.

At least one of the first radius of curvature or the second radius of curvature may be 0.2 times or more of one side of the first or second pad, or one side of the light emitting device package.

The rounding portion included in the first pad and the rounding portion included in the second pad may have a symmetrical or an asymmetrical bottom shape, and the chamfer portion included in the first pad and the chamfer portion included in the second pad may have a symmetrical or an asymmetrical bottom shape.

The rounding portion or the chamfer portion included in the first or second pad may have a symmetrical or an asymmetrical bottom shape or plane shape with respect to a center line passing through the center of the light emitting device.

The first and second pads may be disposed inside a virtual circle centering on the center of the light emitting device.

The light emitting device package may further include a package body forming a cavity in which the light emitting device is disposed; and a molding member disposed in the cavity, enclosing and protecting the light emitting device.

A light emitting apparatus according to another embodiment may include the light emitting device package.

Advantageous Effects

The light emitting device package and the light emitting apparatus including the same according to the embodiment may have improved reliability by minimizing the stress through changing the bottom (or plane) shape of at least one of the first or second pad bonded to the light emitting device.

DESCRIPTION OF DRAWINGS

FIG. 1 is a perspective view of a light emitting device package according to an embodiment.

FIG. 2 is a partial cross-sectional view of the light emitting device package shown in FIG. 1.

FIG. 3 is a table for explaining the stress of a general light emitting device.

FIG. 4 is a bottom view of the first pad, the second pad, and the substrate of the light emitting device package according to the comparative example.

FIGS. 5A to 5F are bottom views of the light emitting device packages according to the embodiment.

BEST MODE

Hereinafter, exemplary embodiments will be described in order to explain the present invention in detail and with reference to the accompanying drawings to aid in understanding of the embodiments. However, the embodiments may be altered in various ways, and the scope of the embodiments should not be construed as being limited to the following description. The embodiments are intended to provide those skilled in the art with more complete explanation.

In the following description of the embodiments, it will be understood that, when each element is referred to as being formed "on" or "under" the other element, it can be directly "on" or "under" the other element, or can be indirectly formed with one or more intervening elements therebetween. In addition, it will also be understood that "on" or "under" the element may mean an upward direction and a downward direction based on the element.

In addition, the relative terms "first", "second", "top/upper/above", "bottom/lower/under" and the like in the description and in the claims may be used to distinguish between any one substance or element and other substances or elements and not necessarily for describing any physical or logical relationship between the substances or elements or a particular order.

In the drawings, the dimensions of layers may be exaggerated, omitted or illustrated schematically for clarity and convenience of description. In addition, the dimensions of constituent elements do not precisely reflect the actual dimensions.

FIG. 1 is a perspective view of a light emitting device package 100 according to an embodiment, and FIG. 2 is a partial cross-sectional view of the light emitting device package 100 shown in FIG. 1. That is, FIG. 2 corresponds to a cross-sectional view of the light emitting device package 100 shown in FIG. 1 viewed from the x-axis direction.

The light emitting device package 100 shown in FIG. 1 may include a package body 110, first and second lead frames 122 and 124, first and second solder portions 132 and 134, first and second pads (or bonding pads) 142 and 144, a light emitting device K, and a molding member 190.

The package body 110 forms a cavity (CA). For example, as shown in FIGS. 1 and 2, the package body 110 may form the cavity CA together with the first and second lead frames 122 and 124. That is, the side surface 112 of the package body 110 and the upper surfaces 122A and 124A of the first and second lead frames 122 and 124 may form the cavity CA. However, the embodiment is not limited to this. That is, unlike the illustrated case, the cavity CA may be formed only by the package body 110. The package body 110 may be formed of an epoxy molding compound (EMC) or the like, but the embodiment is not limited to the material of the package body 110.

The first and second lead frames 122 and 124 may be spaced apart from each other in the y-axis direction perpendicular to the thickness direction of the light emitting structure 170. Each of the first and second lead frames 122 and 124 may be made of a conductive material, for example, metal, and the embodiment is not limited to the kind of material of each of the first and second lead frames 122 and 124. An insulating layer 126 may be disposed between the first and second lead frames 122 and 124 to electrically isolate the first and second lead frames 122 and 124 from each other.

Also, the package body 110 may be formed of a conductive material such as a metal material and the first and second lead frames 122 and 124 may be a part of the package body 110. Even in this case, the package body 110 forming the first and second lead frames 122 and 124 may be electrically isolated from each other by the insulating layer 126.

The first solder part 132 may be disposed on the first lead frame 122 to electrically connect the first lead frame 122 and the first pad 142, and the second solder part 134 may be disposed on the second lead frame 124 to electrically connect the second lead frame 122 to the second pad 144. Each of the first and second solder parts 132 and 134 may be a solder paste or a solder ball.

The aforementioned first and second solder portions 132 and 134 may connect the first and second conductive semiconductor layers 172 and 176 of the light emitting device K, through the first and second pads 142 and 144, to the first and second lead frames 122 and 124, respectively, thereby eliminating the need for wires.

Meanwhile, the light emitting device K may be disposed inside the cavity CA. The light emitting device K may be divided into a lower portion K1 and an upper portion K2. The lower portion K1 of the light emitting device K may include the insulating layers 152, 154 and 156, the first contact layer 162, and the second contact layer 164. The upper portion K2 of the light emitting device K may include the light emitting structure 170 and a substrate 180.

The light emitting structure 170 may be disposed under the substrate 180. The substrate 180 may comprise a conductive material or a non-conductive material. For example, the substrate 180 may include at least one of sapphire ($Al_2O_3$), GaN, SiC, ZnO, GaP, InP, $Ga_2O_3$, GaAs, and Si.

A buffer layer (or transition layer) (not shown) may be further disposed between the substrate 180 and the light emitting structure 170 to improve the difference in coefficient of thermal expansion and lattice mismatch between these 180 and 170. For example, the buffer layer may include at least one material selected from the group consisting of Al, In, N, and Ga, but is not limited to these materials. Further, the buffer layer may have a single layer structure or a multi-layer structure.

The light emitting structure 170 may include a first conductive semiconductor layer 172, an active layer 174, and a second conductive semiconductor layer 176.

The first conductive semiconductor layer 172 may be formed of a Group III-V or II-VI compound semiconductor and doped with a first conductive dopant. If the first conductive semiconductor layer 172 is an n-type semiconductor layer, the first conductive dopant may include Si, Ge, Sn, Se, Te as an n-type dopant, but is not limited to these materials.

For example, the first conductive semiconductor layer 172 may include a semiconductor having the formula of $Al_xIn_yGa_{(1-x-y)}N$ ($0 \le x \le 1$, $0 \le y \le 1$, and $0 \le x+y \le 1$). The first conductive semiconductor layer 172 may include at least one material selected from among GaN, InN, AlN, InGaN, AlGaN, InAlGaN, AlInN, AlGaAs, InGaAs, AlInGaAs, GaP, AlGaP, InGaP, AlInGaP, InP.

The active layer 174 is disposed between the first conductive semiconductor layer 172 and the second conductive semiconductor layer 176, and is a layer in which electrons (or holes) injected through the first conductive semiconductor layer 172 and holes (or electrons) injected through the second conductive semiconductor layer 176 meet each other to emit light having energy determined by the inherent energy band of a constituent material of the active layer 174. The active layer 174 may be formed into at least one structure of a single-well structure, a multi-well structure, a single-quantum well structure, a multi-quantum well (MQW) structure, a quantum wire structure, or a quantum dot structure.

The active layer 174 may include a well layer and a barrier layer having a pair structure of any one or more of InGaN/GaN, InGaN/InGaN, GaN/AlGaN, InAlGaN/GaN, GaAs(InGaAs)/AlGaAs, and GaP(InGaP)/AlGaP, without being limited thereto. The well layer may be formed of a material having lower band gap energy than the band gap energy of the barrier layer.

A conductive clad layer (not illustrated) may be formed above and/or under the active layer 174. The conductive clad layer may be formed of semiconductors having higher band gap energy than the band gap energy of the barrier layer of the active layer 174. For example, the conductive clad layer may include GaN, AlGaN, InAlGaN, or an ultra-lattice structure, etc. In addition, the conductive clad layer may be doped with an n-type or p-type dopant.

According to the embodiment, the active layer 174 can emit light in the ultraviolet wavelength band. Here, the ultraviolet wavelength band means a wavelength band of 100 nm to 400 nm. In particular, the active layer 174 may emit light in a wavelength band of 100 nm to 280 nm. However, the embodiment is not limited to the wavelength band of the light emitted from the active layer 174.

The second conductive semiconductor layer 176 may be formed of a semiconductor compound. The second conductive semiconductor layer 176 may be formed of group III-V or group II-VI compound semiconductors. For example, the second conductive semiconductor layer 176 may comprise a semiconductor material having a composition of $In_xAl_yGa_{1-x-y}N$ ($0 \le x \le 1$, $0 \le y \le 1$, $0 \le x+y \le 1$). The second conductive semiconductor layer 176 may be doped with a second conductive dopant. When the second conductive semiconductor layer 176 is a p-type semiconductor layer, the second conductive dopant may include Mg, Zn, Ca, Sr, Ba, etc as a p-type dopant.

The first conductive semiconductor layer 172 may be implemented in an n-type semiconductor layer, and the second conductive semiconductor layer 176 may be implemented in a p-type semiconductor layer. Alternatively, the first conductive semiconductor layer 172 may be implemented in a p-type semiconductor layer, and the second conductive semiconductor layer 176 may be implemented in an n-type semiconductor layer.

The light emitting structure 170 may be implemented in any one structure selected from among an n-p junction structure, a p-n junction, n-p-n junction structure, and p-n-p junction structure.

Since the light emitting device package 100 illustrated in FIGS. 1 and 2 has a flip chip bonding structure, and therefore light emitted from the active layer 174 may be emitted through the first contact layer 162, the first conductive semiconductor layer 172, and the substrate 180. To this end, the first contact layer 162, the first conductive semiconductor layer 172, and the substrate 180 may be formed of a light transmissive material. At this time, although the second conductive semiconductor layer 176 and the second contact layer 164 may be formed of a light transmissive or light non-transmissive material, or a reflective material, the embodiment may not be limited to a specific material. The material of each of the first and second contact layers 162 and 164 will be described below in detail.

The first contact layer 162 may be disposed between the first conductive semiconductor layer 172 and the first pad 142, so as to electrically connect the first conductive semiconductor layer 172 and the first pad 142 to each other. In case that the first contact layer 162 may comprise an ohmic contact material, and serve as an ohmic layer, a separate ohmic layer (not illustrated) may be unnecessary, or a separate ohmic layer may be disposed above or under the first contact layer 162.

The second contact layer 164 may be disposed between the second conductive semiconductor layer 176 and the second pad 144, so as to electrically connect the second conductive semiconductor layer 176 and the second pad 144 to each other.

Each of the first and second contact layers 162 and 164 may be formed of any material that is capable of reflecting or transmitting light emitted from the active layer 174, rather than absorbing the light, and that is capable of growing in good quality on the first and second conductive semiconductor layers 172 and 176. For example, each of the first and second contact layers 162 and 164 may be formed of a metal, and may be formed of Ag, Ni, Al, Rh, Pd, Ir, Ru, Mg, Zn, Pt, Au, Hf, and selective combinations thereof.

Especially, the second contact layer 164 may be a Transparent Conductive Oxide (TCO) film. For example, the second contact layer 164 may include at least one of the aforementioned metal material, Indium Tin Oxide (ITO), Indium Zinc Oxide (IZO), Indium Zinc Tin Oxide (IZTO), Indium Aluminum Zinc Oxide (IAZO), Indium Gallium Zinc Oxide (IGZO), Indium Gallium Tin Oxide (IGTO), Aluminum Zinc Oxide (AZO), Antimony Tin Oxide (ATO), Gallium Zinc Oxide (GZO), IrOx, RuOx, RuOx/ITO, Ni/IrOx/Au, and Ni/IrOx/Au/ITO, and is not limited to these materials. The second contact layer 164 may include a material for ohmic contact with the second conductive semiconductor layer 176.

In addition, the second contact layer 164 may be a single-layer or multi-layer structure with a reflective electrode material having ohmic characteristics. When the second contact layer 164 serves as an ohmic layer, a separate ohmic layer (not illustrated) may not be formed.

Meanwhile, the first pad 142 may be disposed between the first solder portion 132 and the first conductive semiconductor layer 172, so as to electrically connect the first solder portion 132 and the first conductive semiconductor layer 172 to each other. As illustrated in FIGS. 1 and 2, although the first pad 142 may be implemented in the form of a penetration electrode that penetrates the second contact layer 164, the second conductive semiconductor layer 176, and the active layer 174 so as to be electrically connected to the first conductive semiconductor layer 172, the embodiment is not limited thereto. That is, in another embodiment, although not illustrated, the first pad 142 may bypass the second contact layer 164, the second conductive semiconductor layer 176, and the active layer 174 to thereby be electrically connected to the first conductive semiconductor layer 172.

The insulating layers 152 and 154 of the light emitting device K may be disposed between the second contact layer 164 and the first pad 142 so as to electrically insulate the second contact layer 164 from the first pad 142, be disposed between the second conductive semiconductor layer 176 and the first pad 142 so as to electrically insulate the second conductive semiconductor layer 176 from the first pad 142, and be disposed between the active layer 174 and the first pad 42 so as to electrically insulate the first pad 142 from the active layer 174.

The second pad 144 may be disposed between the second solder portion 134 and the second conductive semiconductor layer 174, so as to electrically connect the second conductive semiconductor layer 174 and the second solder portion 134 to each other. At this time, although the second pad 144 may be implemented in the form of a penetration electrode that penetrates the insulation layers 154 and 156 so as to be connected to the second contact layer 164, the embodiment is not limited thereto. That is, in another embodiment, the second pad 144 may be connected to the second contact layer 164 without penetrating the insulation layers 154 and 156.

The insulating layers 152, 154, and 156 may be formed of a light transmissive insulating material such as SiO2, SiOx, SiOxNy, Si3N4, or Al2O3, but embodiments are not limited to these materials of the insulating layers 152, 154 and 156. Here, although the insulating layers 152, 154, and 156 are shown as being separate layers, they may be a single layer.

Each of the first and second pads 142 and 144 may comprise an electrode material.

Meanwhile, the first pad 142 and the first contact layer 162 may have different coefficients of thermal expansion and the second pad 144 and the second contact layer 164 may have different coefficients of thermal expansion. In addition, the first pad 142 and the insulating layers 152 and 154 may have different coefficients of thermal expansion and the second pad 144 and the insulating layers 154 and 156 may have different coefficients of thermal expansion. The light emitting device package 100 may be stressed due to the difference in coefficient of thermal expansion between the lower portion K1 of the light emitting device K and the first and second pads 142 and 144.

In order to minimize or eliminate such stress, the shapes of the first and second pads 142 and 144 in the light emitting device package 100 according to the embodiment are changed so that the sharp portion of the corner (or at least a part of the side) located away from the center C of the light emitting device K is reduced or eliminated. Hereinafter, this embodiment is described with reference to the accompanying drawings.

FIG. 3 is a table for explaining the stress of a general light emitting device. Here, the first interface (Interface 1) means a boundary between the lower portion K1 and the upper portion K2 of the light emitting device, the second interface (Interface 2) means a boundary between the lower portion K1 of the light emitting device and the first and second pads 142 and 144, the third interface (Interface 3) means a boundary between the first and second pads 142 and 144 and the first and second solder portions 132 and 134, and the fourth interface (Interface 4) means a boundary between the first and second solder portions 132 and 134 and the first and second lead frames 122 and 124.

Referring to FIG. 3, the normal stress is 56.8 and the shear stress is 36.2, at the first interface (Interface 1). Also, the normal stress is 81 and the shear stress is 79.2, at the second interface (Interface 2). In addition, at the interface (Interface 3), the normal stress is 34.9 and the shear stress is 36.9. Also, at the fourth interface (Interface 4), the normal stress is 62.8 and the shear stress is 22.9. Of the first to fourth interfaces (Interfaces 1, 2, 3, and 4), it is noted that the stress is the largest at the second interface 2 (Interface 2). The reason is that, as described above, the difference in coefficient of thermal expansion between the first and second pads 142 and 144 and the layers 152, 154, 156, 162, and 164 is the largest.

In FIG. 3, the directions of the normal stress and shear stress are indicated by arrows. Referring to FIG. 3, it can be seen that the stress is large in the portions 202 and 204 located away from the center C of the light emitting device K. For solving this, at least one of the first or second pad 142 or 144 of the light emitting device package 100 according to the embodiment may include at least one of a rounding portion or a chamfer portion.

Hereinafter, a rounding portion or a chamfer portion included in at least one of the first or second pad 142 or 144 according to the embodiment will be described with reference to the accompanying drawings. For convenience, the parts except for the first and second pads 142 and 144, the first contact layer 162, and the substrate 180 among the components of the light emitting device packages 100A, 100B, 100C, 100D, 100E, and 100F shown in FIGS. 4 and 5a to 5f are omitted.

FIG. 4 is a bottom view of the first pad 142, the second pad 144, and the substrate 180 of the light emitting device package according to the comparative example. Here, C denotes the center of the light emitting device K.

For convenience, in FIGS. 4 and 5a to 5f, each of the first and second pads 142 and 144 is assumed to have a rectangular bottom (or plane) shape, but the embodiment is not limited thereto. That is, each of the first and second pads 142 and 144 may have various bottom shapes other than a square bottom shape.

Referring to FIG. 4, the first and second pads 142 and 144 have a bottom (or plane) shape in which the first and second pads 142 and 144 are disposed to be spaced apart from each other with respect to the center C of the light emitting device K. The first pad 142 includes a first-first edge and a first-second edge, and the second pad 144 includes a second-first edge and a second-second edge. The first-second edge is positioned farther than the first-first edge from the center of the light emitting device K, and the second-second edge is positioned farther than the second-first edge from the center of the light emitting device K. Each of the first-first, first-second, second-first, and second-second edges may include at least one of a corner or a side. For example, as shown in FIG. 4, the first pad 142 may include four sides 142-1, 142-2, 142-3, and 142-4 and four corners C11, C12, C13, and C14. And, the second pad 144 may include four sides 144-1, 144-2, 144-3, and 144-4 and four corners C21, C22, C23, and C24. For example, among the four sides of the first pad 142, each of the first, second, and fourth sides 142-1, 142-2, and 142-4 is positioned farther than the third side 142-3 from the center of the light emitting device C. Accordingly, the third side 142-3 may correspond to the first-first edge, and each of the first, second, and fourth sides 142-1, 142-2, and 142-4 may correspond to the first-first edge. Similarly to this, for example, among the four sides of the second pad 144, each of the second, third, and fourth sides 144-2, 144-3, and 144-4 is positioned farther than the first side 144-1 from the center of the light emitting device C. Accordingly, the first side 144-1 may correspond to the second-first edge, and each of the second, third, and fourth sides 144-2, 144-3, and 144-4 may correspond to the second-second edge.

If the light emitting device package is implemented without a rounding portion or a chamfer portion as shown in FIG. 4, the stresses in the first to fourth interfaces (Interfaces 1 to 4), especially in the second interface (Interface 2) may become serious, as shown in FIG. 3. In order to prevent this, according to the embodiment, at least one of the first or second pad 142 or 144 may include a rounding portion or a chamfer portion at various positions in various shapes as follows.

FIGS. 5A to 5F are bottom views of the light emitting device packages 100A, 100B, 100C, 100D, 100E, and 100F according to the embodiment. Here, reference numeral 160 denotes first and second contact layers 162 and 164, but embodiments are not limited to positions or bottom (or, plane) arrangement shapes of the first and second contact layers 162 and 164. In the following description, the references numbers of the corners and sides of the first and second pads 142 and 144 shown in FIG. 4 may be referred to as the references numbers of the first and second pads 142 and 144 shown in FIGS. 5a to 5f.

According to an embodiment, the rounding portion may include at least one of a rounded corner or a curved side. Referring to FIG. 5a, the first side 142-1 of the first pad 142 is shown as being curved, the second and fourth sides 142-2 and 142-4 are curved, and the third side 142-3 is shown as being a straight line. However, at least one of the second to fourth sides 142-2, 142-3, and 142-4 may be curved. Further, although the third side 144-3 of the second pad 142 is curved, and the second and fourth sides 144-2 and 144-4 are curved, and the first side 144-1 is shown as being a straight line, at least one of the first, second, and fourth sides 144-1, 144-2, and 144-4 may be curved. That is, the first pad 142 may include the first curved side 142-1 as the rounding portion R1, and the second pad 144 may include the third curved side 144-3 as the rounding portion R2.

Referring to FIG. 5b, the first and fourth corners C11 and C14 of the first pad 142 are rounded and the second and third corners C22 and C23 of the second pad 144 are rounded. That is, the first pad 142 may include the first and fourth rounded corners C11 and C14 as the rounding portions R3 and R4, and the second pad 144 may include the second and third rounded corners C22 and C23 as the rounding portions R5 and R6.

Similarly, referring to FIG. 5c, the first and fourth corners C11 and C14 and the second and fourth sides 142-2 and 142-4 of the first pad 142 are rounded and the second and third corners C22 and C23 and the second and fourth sides 144-2 and 144-4 of the second pad 144 are rounded. That is, the first pad 142 may include the first and second rounded corners C11 and C14 and the second and fourth rounded sides 142-2 and 142-4 as the rounding portions R7 and R8, and the second pad 144 may include the second and third rounded corners C22 and C23 and the second and fourth rounded sides 144-2 and 144-4 as the rounding portions R9 and R10. The rounding portions R7 to R10 shown in FIG. 5c may have a larger radius of curvature than the rounding portions R3 to R6 shown in FIG. 5b.

Referring to FIG. 5d, the first and fourth corners C11 and C14 of the first pad 142 are rounded and the second corner C22 of the second pad 144 is rounded. That is, the first pad 142 may include the first and fourth rounded corners C11 and C14 as the rounding portions R11 and R12, and the second pad 144 may include the second rounded corner C22 as the rounding portion R13.

According to an embodiment, the curved side of the rounding portion may have at least one inflection point. For example, referring to FIG. 5a, the first curved side 142-1 of the first pad 142 may have two inflection points P1 and P2, and the third curved side 144-3 of the second pad 144 may have only one inflection point P3. However, the embodiment is not limited thereto. That is, according to another embodiment, the curved side of at least one of the first or second pad 142 or 144 may have three or more inflection points.

In addition, the rounding portion included in the first pad 142 and the rounding portion included in the second pad 144 may have either a symmetrical bottom shape (or, a symmetrical plane shape) or an asymmetrical bottom shape (or, an asymmetrical plane shape). Here, the rounding portion included in the first pad 142 and the rounding portion included in the second pad 144 may have either a symmetrical or an asymmetrical bottom shape (or, a plane shape) with respect to at least one of the first or second center line CL1 or CL2. The first and second center lines CL1 and CL2 pass through the center C of the light emitting device K, intersect at right angle to each other, and extend in a direction perpendicular to the thickness direction of the light emitting device K.

In addition, the chamfer portion may include at least one of the inclined (or chamfered) corner or inclined side. Referring to FIG. 5e, the first corner C11 and the fourth corner C14 of the first pad 142 and the second corner C22 and the third corner C23 of the second pad 144 are shown as being chamfered. In other words, the first pad 142 may include the chamfered portions of the corners C11 and C14 as the chamber portions CH1 and CH2, and the second pad 144 may include the chamfered portions of the second and third corners C22 and C23 as the chamfer portions CH3 and CH4, but the embodiment is not limited thereto.

Referring to FIG. 5f, the first and fourth corners C11 and C14 of the first pad 142 and the second corner C22 of the second pad 144 are shown as being chamfered. That is, the first pad 142 may include the chamfered portions of the first and fourth corners C11 and C14 as the chamfer portions CH5 and CH6, and the second pad 144 may include the chamfered portion of the second corner 144 as the chamfer portion CH7, but the embodiment is not limited thereto.

In addition, the chamfer portion included in the first pad 142 and the chamfer portion included in the second pad 144 may have a symmetrical bottom shape (or symmetrical planar shape), or may have an asymmetric bottom shape (or an asymmetric planar shape). Here, the chamfer portion included in the first pad 142 and the chamfer portion included in the second pad 144 may have a symmetric or asymmetric bottom surface shape (or, planar shape) with respect to at least one of the first or second center line CL1 or CL2.

As illustrated as example in FIGS. 5a to 5f, when the thickness direction of the light emitting device K is the z-axis direction, the first center line CL1 corresponds to a line which extends along the x-axis orthogonal to the z-axis and passes through the center C, and the second center line CL2 corresponds to a line which extends in the y-axis orthogonal to the z-axis and passes through the center C, but the embodiments are not limited thereto. In other words, the first center line CL1 may correspond to a line extending in the y axis and the second center line CL2 may correspond to a line extending in the x axis. In this manner, the first and second center lines CL1 and CL2 are orthogonal to each other. Here, the x-axis, the y-axis, and the z-axis may be orthogonal to one another or may be axes that intersect one another.

For example, as illustrated as example in FIG. 5a, the rounding portion R1 of the first pad 142 and the rounding portion R2 of the second pad 144 have the asymmetric bottom shape (or the asymmetric plane shape) with respect to the first center line CL1. In addition, as illustrated as example in FIG. 5d or 5f, the rounding portions R11 and R12 (or the chamfer portions CH5 and CH6) of the first pad 142 and the rounding portion R13 (or the chamfer portion CH7) of the second pad 144 have a bottom shape (or a plane shape) that is asymmetrical with respect to the first center line CL1.

Alternatively, as illustrated as example in FIG. 5b or FIG. 5e, the rounding portions R3 and R4 (or the chamfer portions CH1 and CH2) included in the first pad 142 and the rounding portions R5 and R6 (or, the chamfer portions CH3 and CH4) included in the second pad 144 may have bottom shape that is symmetrical with respect to the first center line CL1. Further, as illustrated as example in FIG. 5c, the rounding portions R7 and R8 included in the first pad 142 and the rounding portions R9 and R10 in the second pad 144 may bottom shape (or, plane shape) that is symmetrical with respect to the first center line CL1.

Further, as illustrated as example in FIG. 5c, the first and second pads 142 and 144 may be disposed inside a virtual circle 210 centering on the center C of the light emitting device K. In this case, the first radii of curvature of the rounding portions R7 and R8 included in the first pad 142 may be equal to the second radii of curvature of the rounding portions R9 and R10 included in the second pad 144. However, according to another embodiment, the first radius of curvature and the second radius of curvature may be different from each other. For example, as illustrated in FIG. 5a, the first radius of curvature of the rounding portion R1 included in the first pad 142 may be different from the second radius of curvature of the rounding portion R2 included in the second pad 144.

Further, the first radius of curvature of the rounding portion included in the first pad 142 may be equal to or greater than or less than the second radius of curvature of the rounding portion included in the second pad 144. For example, as illustrated as example in FIG. 5a, the first radius of curvature of the rounding portion R1 included in the first pad 142 may be less than the second radius of curvature of the rounding portion R2 included in the second pad 144.

In addition, at least one of the first radius of curvature of the rounding portion included in the first pad 142 or the second radius of curvature of the rounding portion included in the second pad 144 may 0.2 times or more of one side (or, one side L1 or L2 of the light emitting device package, in particular, L1) of the first or second pad 142 or 144. For example, when the length of one side (L1 or L2) of the first or second pad 142 or 144 is 300 μm, at least one of the first or second radius of curvature may be 60 μm or more.

In addition, the rounding portions (or chamfer portions) included in each of the first and second pads 142 and 144 may have symmetrical or asymmetrical bottom shape (or, plane shape) with respect to the second center line CL2 of the light emitting device K.

For example, as illustrated in FIG. 5a, the rounding portion R1 included in the first pad 142 may be symmetrical with respect to the second center line CL2, and the rounding portion R2 included in the second pad 144 may be symmetrical with respect to the second center line CL2.

Also, as illustrated as example in FIG. 5b or FIG. 5e, the rounding portions R3 and R4 (or the chamfer portions CH1 and CH2) included in the first pad 142 may be symmetrical with respect to the second center line CL2, and the rounding portions R5 and R6 (or the chamfer portions CH3 and CH4) included in the second pad 144 may be symmetrical with respect to the second center line CL2.

Further, as illustrated as example in FIG. 5c, the rounding portions R7 and R8 included in the first pad 142 may be symmetrical with respect to the second center line CL2, and the rounding portions R9 and R10 included in the second pad 144 may be symmetrical with respect to the second center line CL2.

However, as illustrated as example in FIG. 5d or FIG. 5f, the rounding portions R11 and R12 (or the chamfer portions CH5 and CH6) included in the first pad 142 may be symmetric with respect to the second center line CL2, while the rounding portion R13 (or the chamfer portion CH7) included in the second pad 144 may be asymmetric with respect to the second center line CL2.

In addition, assuming that the total sum of the first plane area of the first pad 142 and the second plane area of the second pad 144 as shown in FIG. 4 is 100%, the shape of at least one of the first pad 142 or the second pad 144 may be changed so that the total sum of the first planar area of the first pad 142 and the second planar area of the second pad 144 according to the embodiment is 65% to 95%.

For example, in case that the first and second pads 142 and 144 of the light emitting device packages 100A are implemented as shown in FIG. 5a, the total sum of the first and second plane areas of the first and second pads 142 and 144 may be 65% of the total sum of the first and second plane areas shown in FIG. 4.

In addition, when the first and second pads 142 and 144 of the light emitting device packages 100B and 100E are implemented as shown in FIG. 5b or 5e, the total sum of the first and second planes areas of the first and second pads 142 and 144 is 90% of the total sum of the first and second plane areas shown in FIG. 4.

In addition, when the first and second pads 142 and 144 of the light emitting device packages 100C are implemented as shown in FIG. 5c, the total sum of the first and second planes areas of the first and second pads 142 and 144 is 88% of the total sum of the first and second plane areas shown in FIG. 4.

In addition, when the first and second pads 142 and 144 of each of the light emitting device packages 100D and 100F are implemented as shown in FIG. 5d or 5f, the total sum of the first and second planes areas of the first and second pads 142 and 144 is 95% of the total sum of the first and second plane areas shown in FIG. 4.

Referring to FIGS. 5a to 5f, the rounded or chamfered corners C11, C14, C22, and C23 may include a corner located farthest from the center C of the light emitting device K among the plurality of corners C11 to C14 and C21 to C24. That is, according to an embodiment, the rounding portion or the chamfer portion is positioned at at least one of the first-second edge or the second-second edge. This is because, as described above in FIG. 3, the shear stress which the light emitting device may get increases as the distance from the center C of the light emitting device K increases. When at least one of the side (or a portion of side) or corner located farther from the center C of the light emitting device K is formed in a rounded or chamfered shape, the stress shown in FIG. 3 may be minimized (or removed).

Meanwhile, referring to FIGS. 1 and 2, the molding member 190 of the light emitting device package 100 may enclose and protect the light emitting device K. The molding member 190 may be formed of, for example, silicon (Si) and contain phosphors, thus being capable of changing the wavelength of light emitted from the light emitting device K. Although the phosphors may include phosphors selected from among YAG-based, TAG-based, silicate-based, sulfide-based, and nitride-based wavelength change materials which may change light generated from the light emitting device K into white light, the embodiment is not limited to the kinds of phosphors.

The YGA-based and TAG-based phosphors may be selected from among (Y, Tb, Lu, Sc, La, Gd, Sm)3(Al, Ga, In, Si, Fe)5(O, S)12:Ce, and the silicate-based phosphors may be selected from among (Sr, Ba, Ca, Mg)2SiO4:(Eu, F, Cl).

In addition, the sulfide-based phosphors may be selected from among (Ca, Sr)S:Eu, (Sr, Ca, Ba)(Al, Ga)2S4:Eu, and the nitride-based phosphors may be selected from among (Sr, Ca, Si, Al, O)N:Eu (e.g., CaAlSiN4:Eu β-SiAlON:Eu) or Ca-α SiAlON:Eu-based (Cax, My)(Si, Al)12(O, N)16 (here, M is at least one of Eu, Tb, Yb, or Er, $0.05<(x+y)<0.3$, $0.02<x<0.27$, and $0.03<y<0.3$).

Red phosphors may be nitride-based phosphors including N (e.g., CaAlSiN3:Eu). The nitride-based red phosphors have higher reliability in resistance to external environments such as, for example, heat and moisture and lower discoloration risk than sulfide-based phosphors.

Generally, when two layers having different coefficients of thermal expansion are laminated, various stresses may be caused as shown in FIG. 3. That is, when the first and second pads 142 and 144 are bonded to the lower portion K1 of the light emitting device K at a temperature of 200° C. or more, the residual stress induced from the different coefficients of thermal expansion of these (K1, 142, 144) may cause initial failure and cumulative fatigue, so that the light emitting device package may be broken.

Thus, according to the embodiment, by changing the bottom (or plane) shape of at least one of the first or second pad 142 or 144, the stresses which the light emitting device packages 100, 100A to 100D, 100E, and 100F get may be minimized, and the reliability can be improved.

In the light emitting device package according to the embodiment, an array of a plurality of light emitting device packages may be disposed on a board, and optical members such as a light guide plate, a prism sheet, and a diffuser sheet may be disposed in an optical path of the light emitting device packages. The light emitting device packages, the board, and the optical members may function as a backlight unit.

In addition, the light emitting device package according to the embodiment may be included in a light emitting apparatus such as, for example, a display apparatus, an indicator apparatus, and a lighting apparatus.

Here, the display apparatus may include a bottom cover, a reflective plate disposed on the bottom cover, a light emitting module configured to emit light, a light guide plate disposed in front of the reflective plate to forwardly guide light emitted from the light emitting module, optical sheets including prism sheets disposed in front of the light guide plate, a display panel disposed in front of the optical sheets, an image signal output circuit connected to the display panel to supply an image signal to the display panel, and a color filter disposed in front of the display panel. Here, the bottom cover, the reflective plate, the light emitting module, the light guide plate, and the optical sheets may constitute a backlight unit.

In addition, the lighting apparatus may include a light source module which includes a board and the light emitting device package according to the embodiment, a radiator configured to radiate heat of the light source module, and a power supply unit configured to process or convert an electrical signal from an external source so as to supply the same to the light source module. For example, the lighting apparatus may include a lamp, a headlamp, or a streetlight.

The headlamp may include a light emitting module which includes the light emitting device packages arranged on a board, a reflector configured to reflect light emitted from the light source module, in a given direction, for example, forwardly, a lens configured to forwardly refract light reflected by the reflector, and a shade configured to achieve a light distribution pattern intended by a designer by blocking or reflecting some of light, reflected by the reflector and directed to the lens.

While the present invention has been particularly shown and described with reference to exemplary embodiments thereof so far, these embodiments are merely examples of the present invention and should not be intended to limit the present invention. It should be to be understood that the various modifications and applications not so far described are possible by those of ordinary skill in the art to which the present invention pertains within the range that does not deviated from the essential scope of the present embodiments. For example, respective components specifically shown in the embodiments may be modified and implemented. And, differences related to such variations and applications should be interpreted as being within the scope of the present invention as defined in the appended claims.

MODE FOR INVENTION

Various embodiments have been described in the best mode for carrying out the invention.

INDUSTRIAL APPLICABILITY

The light emitting device package according to the embodiment may be included in the light emitting apparatus such as a display apparatus, an indicator apparatus, and a lighting apparatus. The light emitting apparatus may be applied to vehicle, which requires the light source, etc.

The invention claimed is:

1. A light emitting device package, comprising: a light emitting device including a light emitting structure comprising a first conductive semiconductor layer, an active layer, and a second conductive semiconductor layer; first and second lead frames disposed to be spaced apart from each other; first and second solder portions disposed on the first and second lead frames, respectively; and first and second electrodes disposed between the first and second solder portions and the first and second conductive semiconductor layers, respectively, wherein each of the first and second electrodes has a bottom shape that includes at least one of a rounding portion or a chamfer portion, wherein the bottom shapes of the first and second electrodes are spaced apart from each other with respect to a center of the light emitting device, wherein the bottom shape of the first electrode comprises: a first-first edge; a first-second edge positioned farther than the first-first edge from the center of the light emitting device; and a first-third edge and a first-fourth edge that extend in parallel between the first-first edge and the first-second edge, wherein the bottom shape of the second electrode comprises: a second-first edge; a second-second edge positioned farther than the second-first edge from the center of the light emitting device; and a second-third edge and a second-fourth edge that extend in parallel between the second-first edge and the second-second edge, wherein the first electrode and the second electrode are disposed adjacent to each other such that the first-first edge of the first electrode and the second-first edge of the second electrode face each other, wherein the at least one of the rounding portion or the chamfer portion for the first electrode is positioned at an intersection of the first-second edge and at least one of the first-third edge or the first-fourth edge, and the at least one of the rounding portion or the chamfer portion for the second electrode is positioned at an intersection of the second-second edge and at least one of the second-third edge or the second-fourth edge, such that the at least one of the rounding portion or the chamfer portion for the first electrode is positioned away from the first-first edge and the at least one of the rounding portion or the chamfer portion for the second electrode is positioned away from the second-first edge, wherein the first-first edge and the second-first edge are straight edges which face each other and are closer to the center of the light emitting device than the first-second edge and the second-second edge, respectively, wherein a shear stress applied to the light emitting device package increases as a distance from the center of the light emitting device increases, and wherein the light emitting device package further includes: a first contact layer disposed between the first conductive semiconductor layer and the first electrode, a second contact layer disposed between the second conductive semiconductor layer and the second electrode, a first insulating layer contacting the first contact layer and disposed between the first electrode and each of a first portion of the active layer and a first portion of the second conductive semiconductor layer, and a second insulating layer extending between the first contact layer and the second contact layer, and disposed between the first electrode and each of the second contact layer, a second portion of the active layer, and a second portion of the second conductive semiconductor layer.

2. The light emitting device package according to claim 1, wherein each of the first-first, first-second, second-first, and second-second edges comprises at least one of a corner or a side,
wherein the rounding portion includes at least one of a rounded corner or a curved side, and
wherein the chamfer portion includes at least one of a chamfered corner or a inclined side.

3. The light emitting device package according to claim 2, wherein each of the first and second electrodes includes a plurality of corners, and
wherein the rounded or chamfered corner for each of the first electrode and second electrode includes one of the plurality of corners located farthest from the center of the light emitting device.

4. The light emitting device package according to claim 2, wherein each of the first and second electrodes includes a plurality of sides, and
wherein the curved side for each of the first electrode and second electrode includes one of the plurality of sides located farthest from the center of the light emitting device.

5. The light emitting device package according to claim 2, wherein the curved side for at least one of the first electrode or the second electrode includes at least one inflection point.

6. The light emitting device package according to claim 1, wherein the light emitting device further comprises first and second contact layers disposed between the first and second conductive semiconductor layers and the first and second electrodes, respectively.

7. The light emitting device package according to claim 6, wherein the first electrode and the first contact layer have different coefficients of thermal expansion, and
wherein the second electrode and the second contact layer have different coefficients of thermal expansion.

8. The light emitting device package according to claim 1, wherein, when the first electrode and the second electrode include the rounding portions, a first radius of curvature of the rounding portion included in the first electrode is different from a second radius of curvature of the rounding portion included in the second electrode.

9. The light emitting device package according to claim 8, wherein at least one of the first radius of curvature or the second radius of curvature is 0.2 times or more of a length of one side of the first or second electrode or one side of the light emitting device package.

10. The light emitting device package according to claim 1, wherein, when the first electrode and the second electrode include the rounding portions, a first radius of curvature of the rounding portion included in the first electrode is equal to a second radius of curvature of the rounding portion included in the second electrode.

11. The light emitting device package according to claim 1, wherein, when the first electrode and the second electrode include the rounding portions, a first radius of curvature of the rounding portion included in the first electrode is greater than a second radius of curvature of the rounding portion included in the second electrode.

12. The light emitting device package according to claim 1, wherein, when the first electrode and the second electrode include the rounding portions, a first radius of curvature of the rounding portion included in the first electrode is less than a second radius of curvature of the rounding portion included in the second electrode.

13. The light emitting device package according to claim 1, wherein, when the first electrode and the second electrode include the rounding portions, the rounding portion included in the first electrode and the rounding portion included in the second electrode have a symmetrical bottom shape, or
wherein, when the first electrode and the second electrode include the chamfer portions, the chamfer portion included in the first electrode and the chamfer portion included in the second electrode have a symmetrical bottom shape.

14. The light emitting device package according to claim 1, wherein, when the first electrode and the second electrode include the rounding portions, the rounding portion included in the first electrode and the rounding portion included in the second electrode have an asymmetrical bottom shape, or
wherein, when the first electrode and the second electrode include the chamfer portions, the chamfer portion included in the first electrode and the chamfer portion included in the second electrode have an asymmetrical bottom shape.

15. The light emitting device package according to claim 1, wherein the at least one of the rounding portion or the chamfer portion included in the first or second electrode has a symmetrical bottom shape with respect to a center line passing through the center of the light emitting device.

16. The light emitting device package according to claim 1, wherein the at least one of the rounding portion or the chamfer portion included in the first or second electrode has an asymmetrical bottom shape with respect to a center line passing through the center of the light emitting device.

17. The light emitting device package according to claim 1, further comprising:
   a package body forming a cavity in which the light emitting device is disposed; and
   a molding member disposed in the cavity, enclosing and protecting the light emitting device.

18. A light emitting apparatus comprising the light emitting device package according to claim 1.

19. A light emitting device package, comprising: a light emitting device including a light emitting structure comprising a first conductive semiconductor layer, an active layer, and a second conductive semiconductor layer; first and second lead frames disposed to be spaced apart from each other; first and second solder portions disposed on the first and second lead frames, respectively; and first and second electrodes disposed between the first and second solder portions and the first and second conductive semiconductor layers, respectively, wherein at least one of the first or second electrodes has a bottom shape that includes at least one of a rounding portion or a chamfer portion, wherein the bottom shapes of the first and second electrodes are spaced apart from each other with respect to a center of the light emitting device, wherein the bottom shape of the first electrode comprises: a first-first edge; a first-second edge positioned farther than the first-first edge from the center of the light emitting device; and a first-third edge and a first-fourth edge that extend in parallel between the first-first edge and the first-second edge, wherein the bottom shape of the second electrode comprises: a second-first edge; a second-second edge positioned farther than the second-first edge from the center of the light emitting device; and
   a second-third edge and a second-fourth edge that extend in parallel between the second-first edge and the second-second edge, wherein the at least one of the rounding portion or the chamfer portion is positioned at at least one of an intersection of the first-second edge and at least one of the first-third edge or the first-fourth edge or an intersection of the second-second edge and at least one of the second-third edge or the second-fourth edge, such that the at least one of the rounding portion or the chamfer portion is positioned away from, respectively, at least one of the first-first edge and the second-first edge, wherein the light emitting device further comprises a first contact layer disposed between the first conductive semiconductor layer and the first electrode, and a second contact layer disposed between the second conductive semiconductor layer and the second electrode, wherein the first electrode is connected to the first conductive semiconductor layer by passing through the second contact layer, the second conductive semiconductor layer, and the active layer, wherein the light emitting device further comprises: a first insulating layer contacting the first contact layer and disposed between the first electrode and each of a first portion of the second conductive semiconductor layer and a first portion of the active layer, and a second insulating layer contacting the first contact layer and disposed between the first electrode and each of the second contact layer, a second portion of the second conductive semiconductor layer, and a second portion of the active layer, and wherein the insulating layer and each of the first and second electrodes have different coefficients of thermal expansion.

* * * * *